(12) United States Patent
Chang et al.

(10) Patent No.: US 9,258,908 B2
(45) Date of Patent: Feb. 9, 2016

(54) SUBSTRATE STRUCTURE HAVING COMPONENT-DISPOSING AREA AND MANUFACTURING PROCESS THEREOF

(71) Applicant: Unimicron Technology Corp., Taoyuan (TW)

(72) Inventors: Cheng-Jui Chang, Taipei (TW); Ming-Hao Wu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 200 days.

(21) Appl. No.: 13/740,286

(22) Filed: Jan. 14, 2013

(65) Prior Publication Data

US 2014/0138130 A1 May 22, 2014

(30) Foreign Application Priority Data

Nov. 21, 2012 (TW) .............................. 101143499 A

(51) Int. Cl.
*H05K 1/16* (2006.01)
*H05K 3/46* (2006.01)
(Continued)

(52) U.S. Cl.
CPC ............. *H05K 3/4697* (2013.01); *H01L 23/13* (2013.01); *H01L 24/32* (2013.01); *H01L 21/4857* (2013.01); *H01L 23/49822* (2013.01); *H01L 2224/16225* (2013.01); *H01L 2224/32225* (2013.01); *H01L 2224/48091* (2013.01); *H01L 2224/48227* (2013.01); *H01L 2224/48228* (2013.01); *H01L 2224/73265* (2013.01);
(Continued)

(58) Field of Classification Search
USPC ................. 174/260, 250, 251, 261, 262, 268; 361/761; 257/678, 686, 690, 693, 700, 257/702, 737; 438/108, 109, 125, 618
See application file for complete search history.

(56) References Cited

U.S. PATENT DOCUMENTS 4,558,171 A * 12/1985 Gantley et al. ............. 174/50.61
6,084,297 A * 7/2000 Brooks et al. ................ 257/698
(Continued)

FOREIGN PATENT DOCUMENTS

TW 201225770 6/2012

OTHER PUBLICATIONS

"Office Action of Taiwan Counterpart Application", issued on Jul. 28, 2014, p. 1-p. 8.

*Primary Examiner* — Xiaoliang Chen
(74) *Attorney, Agent, or Firm* — Jianq Chyun IP Office

(57) ABSTRACT

A substrate structure having a component-disposing area and a process thereof are provided. The substrate structure having a component-disposing area includes a core layer, a first dielectric-layer, a laser-resistant metallic-pattern and a second dielectric-layer. The core layer includes a first surface, a component-disposing area and a patterned metallic-layer disposed on the first surface and including multiple pads, and the pads are located within the component-disposing area. The first dielectric-layer is disposed on the core layer and includes multiple openings to respectively expose the pads. The laser-resistant metallic-pattern is disposed on the first dielectric-layer and surrounds a projection area of the first dielectric-layer which the component-disposing area is orthogonally projected on. The second dielectric-layer is disposed on the first dielectric-layer and covers the laser-resistant metallic-pattern, the second dielectric-layer includes a component-disposing cavity corresponding to the projection area, penetrating through the second dielectric-layer and communicated with the openings to expose the pads.

5 Claims, 5 Drawing Sheets

US 9,258,908 B2
Page 2

(51) Int. Cl.
   *H01L 23/13* (2006.01)
   *H01L 23/00* (2006.01)
   *H01L 23/498* (2006.01)
   *H05K 1/18* (2006.01)
   *H01L 21/48* (2006.01)

(52) U.S. Cl.
   CPC ....... *H01L2924/12042* (2013.01); *H05K 1/183* (2013.01); *H05K 2201/09127* (2013.01)

(56) References Cited

U.S. PATENT DOCUMENTS

| | | | |
|---|---|---|---|
| 6,740,971 B2* | 5/2004 | Brooks et al. | 257/738 |
| 6,787,398 B2* | 9/2004 | Tateoka et al. | 438/125 |
| 8,084,850 B2* | 12/2011 | Shin | 257/684 |
| 8,647,926 B2* | 2/2014 | Shin et al. | 438/109 |
| 2005/0048759 A1* | 3/2005 | Hsu | 438/618 |
| 2005/0189644 A1* | 9/2005 | Ho et al. | 257/700 |
| 2006/0017152 A1* | 1/2006 | White et al. | 257/700 |
| 2006/0043568 A1* | 3/2006 | Abe et al. | 257/698 |
| 2006/0051895 A1* | 3/2006 | Abe et al. | 438/108 |
| 2007/0025092 A1* | 2/2007 | Lee et al. | 361/761 |
| 2008/0102410 A1* | 5/2008 | Kim et al. | 430/312 |
| 2008/0230892 A1* | 9/2008 | Chang et al. | 257/700 |
| 2008/0265395 A1* | 10/2008 | Hasegawa et al. | 257/690 |
| 2009/0026604 A1* | 1/2009 | Shin et al. | 257/702 |
| 2009/0126981 A1* | 5/2009 | Horiuchi et al. | 174/262 |
| 2009/0250803 A1* | 10/2009 | Arai | 257/690 |
| 2010/0019368 A1* | 1/2010 | Shin | 257/686 |
| 2010/0208442 A1* | 8/2010 | Asano et al. | 361/783 |
| 2010/0224397 A1* | 9/2010 | Shimizu et al. | 174/260 |
| 2010/0252303 A1* | 10/2010 | Chang | 174/251 |
| 2011/0024899 A1* | 2/2011 | Masumoto et al. | 257/737 |
| 2012/0181074 A1* | 7/2012 | Ishihara et al. | 174/261 |
| 2012/0286414 A1* | 11/2012 | Meyer-Berg | 257/698 |
| 2013/0020120 A1* | 1/2013 | Ishihara et al. | 174/262 |
| 2013/0082386 A1* | 4/2013 | Meyer-Berg et al. | 257/762 |
| 2013/0299223 A1* | 11/2013 | Yoo et al. | 174/259 |

* cited by examiner

SUBSTRATE STRUCTURE HAVING COMPONENT-DISPOSING AREA AND MANUFACTURING PROCESS THEREOF

CROSS-REFERENCE TO RELATED APPLICATION

This application claims the priority benefit of Taiwan application serial no. 101143499, filed on Nov. 21, 2012. The entirety of the above-mentioned patent application is hereby incorporated by reference herein and made a part of this specification.

BACKGROUND

1. Field of the Disclosure

The disclosure generally relates to a substrate structure and a manufacturing process thereof, and more particularly, to a substrate structure having a component-disposing area and a manufacturing process thereof.

2. Description of Related Art

In recent years, with ever-changing advances in electronic technology, high-tech electronics industry appeared one after another, which makes the more humanized and better in function electronic products continue to be launched. And these electronic products are developing toward the light, thin, short and small figure design. Usually in these electronic products, a circuit substrate is disposed for carrying single electronic component or a plurality of electronic components. However, disposing the electronic components on a circuit substrate will result in an increase of carrying area, and thus how to make the electronic components hidden in the circuit substrate has become a key technology in today.

In the prior art, to bury the components in a substrate, it needs to form an open hole in a core layer by laser drilling or mechanical drilling, followed by disposing the components in the open hole. However, the components must be electrically connected to the circuit layer of the circuit substrate through pads, and thus, a solder mask layer must be formed in advance in the process at the position where the open hole is disposed to facilitate the successive process of pads. In particular, the process should be performed separately from other processes of the circuit substrate, which makes the process more complicated. Specifically, during the laser drilling for the open hole, the penetrating depth of laser must be controlled very accurately to avoid penetrating the solder mask layer by drilling or having residue of the solder mask layer. All the above-mentioned issues increase the fabrication difficulty of the circuit substrate having components disposed therein. In addition, since the thickness of a core layer is usually less than 100 microns ($\mu$m), which is also a great challenge for today's solder-resist fabrication.

SUMMARY OF THE DISCLOSURE

Accordingly, the disclosure is directed to a substrate structure having a component-disposing area, which has simpler process and higher production yield rate.

The disclosure is also directed to a process for a substrate having a component-disposing area, which has simpler steps and higher product yield rate.

The disclosure provides a substrate structure having a component-disposing area, which includes a core layer, a first dielectric layer, a laser-resistant metallic pattern and a second dielectric layer. The core layer includes a first surface, a patterned metallic layer and a component-disposing area, in which the patterned metallic layer is disposed on the first surface and includes a plurality of pads and the pads are located within the component-disposing area. The first dielectric layer is disposed on the core layer and includes a plurality of openings respectively exposing the pads. The laser-resistant metallic pattern is disposed on the first dielectric layer and surrounds a projection area of the first dielectric layer which the component-disposing area is orthogonally projected on. The second dielectric layer is disposed on the first dielectric layer and covers the laser-resistant metallic pattern. The second dielectric layer includes a component-disposing cavity corresponding to the projection area, penetrating through the second dielectric layer and communicated with the openings to expose the pads.

The disclosure provides a process for a substrate having a component-disposing area, and the process includes the following steps. Firstly, a core layer including a first surface, a metallic layer and a component-disposing area is provided. The metallic layer is disposed on the first surface. Next, the metallic layer is patterned to form a patterned metallic layer, in which the patterned metallic layer includes a plurality of pads located in the component-disposing area. Then, a first dielectric layer is formed on the first surface, in which the first dielectric layer covers the patterned metallic layer. Further, a laser-resistant metallic pattern is formed on the first dielectric layer, in which the laser-resistant metallic pattern surrounds a projection area of the first dielectric layer which the component-disposing area is orthogonally projected on. After that, a release film is disposed on the projection area of the first dielectric layer, in which the release film covers a portion of the laser-resistant metallic pattern within the projection area. Then, a second dielectric layer is formed on the first dielectric layer, in which the second dielectric layer covers the release film and the laser-resistant metallic pattern. Further, a first open hole and a plurality of second open holes are formed, in which the first open hole surrounds the projection area and penetrates through the second dielectric layer to extend to the laser-resistant metallic pattern, and the second open holes respectively penetrate through the second dielectric layer and extend to the pads; finally, making the release film separated from the first dielectric layer to form a component-disposing cavity.

In an embodiment of the disclosure, the component-disposing cavity exposes out the part of the laser-resistant metallic pattern surrounding the projection area.

In an embodiment of the disclosure, the substrate structure having a component-disposing area further includes an electronic component, disposed in the component-disposing cavity and electrically connected to the pads.

In an embodiment of the disclosure, the substrate structure having a component-disposing area further includes a plurality of bonding wires, electrically connected to the pads and the electronic component respectively.

In an embodiment of the disclosure, the substrate structure having a component-disposing area further includes a plurality of solder balls, electrically connected to the pads and the electronic component respectively.

In an embodiment of the disclosure, the material of the laser-resistant metallic pattern includes copper, palladium, nickel and silver.

In an embodiment of the disclosure, the method of forming the first open hole and the second open holes includes laser drilling.

In an embodiment of the disclosure, the process for a substrate having a component-disposing area further includes disposing at least one electronic component in the component-disposing cavity, in which the electronic component is electrically connected to the pads.

In an embodiment of the disclosure, the electronic component is electrically connected to the pads by wire bonding or flip-chip bonding.

Based on the depiction above, in the disclosure, the dielectric layers are substituted for the solder mask layer disposed on the core layer within the component-disposing area in the prior art, so that, in the disclosure, the dielectric layers located on the inside and the outside of the component-disposing area can be integrally and simultaneously formed, which simplifies the conventional complicated substrate process. In addition, in the disclosure, a laser-resistant metallic pattern is disposed on the dielectric layer for preventing the laser drilling from penetrating through the dielectric layer, unlike the prior art where the laser-resistant metallic pattern and the pads are together disposed on the core layer so as to avoid the difficulty in the laser drilling depth control. In short, the disclosure certainly simplifies the process for a substrate having a component-disposing area and advances the product yield rate.

In order to make the features and advantages of the present disclosure more comprehensible, the present disclosure is further described in detail in the following with reference to the embodiments and the accompanying drawings.

DESCRIPTION OF THE EMBODIMENTS

Figure 1A:
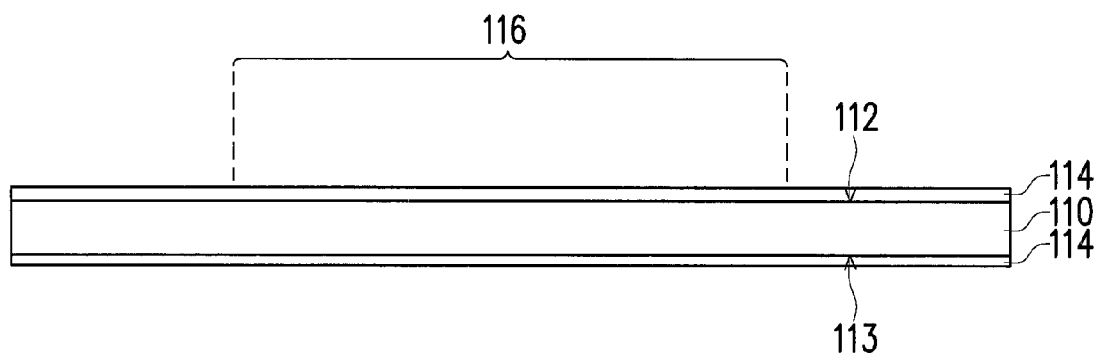
FIGS. 1A-1H are cross-sectional diagrams showing a manufacturing process of a substrate having a component-disposing area according to an embodiment of the disclosure.

FIGS. 1A-1H are cross-sectional diagrams showing a manufacturing process of a substrate having a component-disposing area according to an embodiment of the disclosure. Referring to FIG. 1A, a manufacturing process of a substrate having a component-disposing area in the embodiment includes following steps. First, a core layer 110 shown by FIG. 1A including a first surface 112, a metallic layer 114 and a component-disposing area 116 is provided. The metallic layer 114 is disposed on the first surface 112 and the component-disposing area 116 is an area on the surface of the core layer 110 for disposing an electronic component. It should be noted that, in the embodiment, the core layer 110 is a bi-surfaces copper foil core layer, i.e., the two opposite surfaces (the first surface 112 and a second surface 113 opposite to each other) of the core layer 110 respectively have two copper foils (the metallic layer 114 as shown by FIG. 1A), and circuit layers are simultaneously fabricated on the two opposite surfaces of the core layer 110 to improve the production efficiency. The following process is against the first surface 112 of the core layer 110, and the disclosure does not limit the structure on the second surface 113 of the core layer 110 and the process thereof.

Figure 1B:
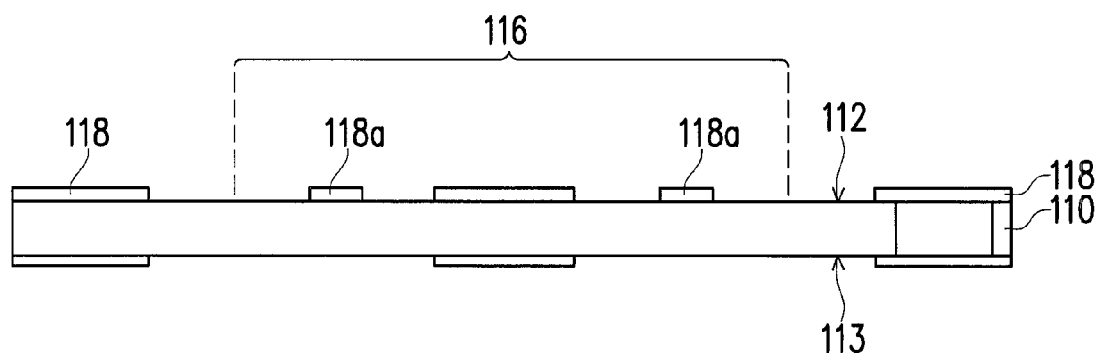
Figure 1C:
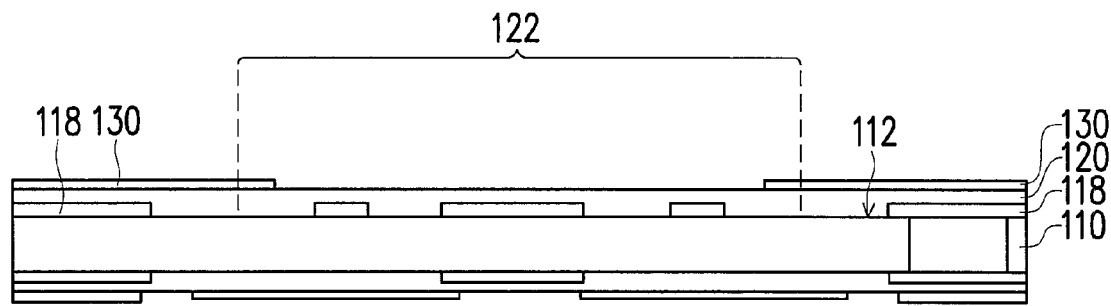

Next, referring to FIGS. 1A and 1B, a pattering process is performed on the metallic layer 114 in FIG. 1A to form a patterned metallic layer 118 as shown by FIG. 1B. The patterned metallic layer 118 includes a plurality of pads 118a. The pads 118a are within the component-disposing area 116. Then, as shown by FIG. 1C, a first dielectric layer 120 is formed on the first surface 112, in which the first dielectric layer 120 covers the patterned metallic layer 118 and then a laser-resistant metallic pattern 130 is formed on the first dielectric layer 120. The laser-resistant metallic pattern 130 surrounds a projection area 122 as shown by FIG. 1C, and a part of the laser-resistant metallic pattern 130 is overlapped with the periphery of the projection area 122. The projection area 122 herein is an area which the component-disposing area 116 in FIG. 1B is orthogonally projected on the first dielectric layer 120.

Figure 1D:
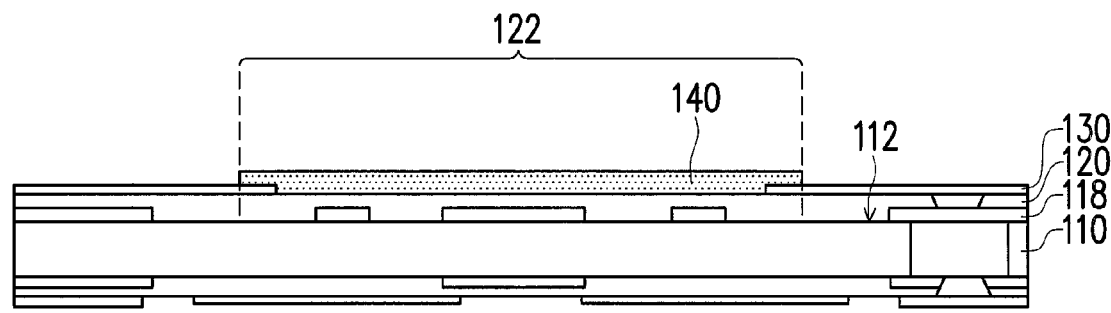
Figure 1E:
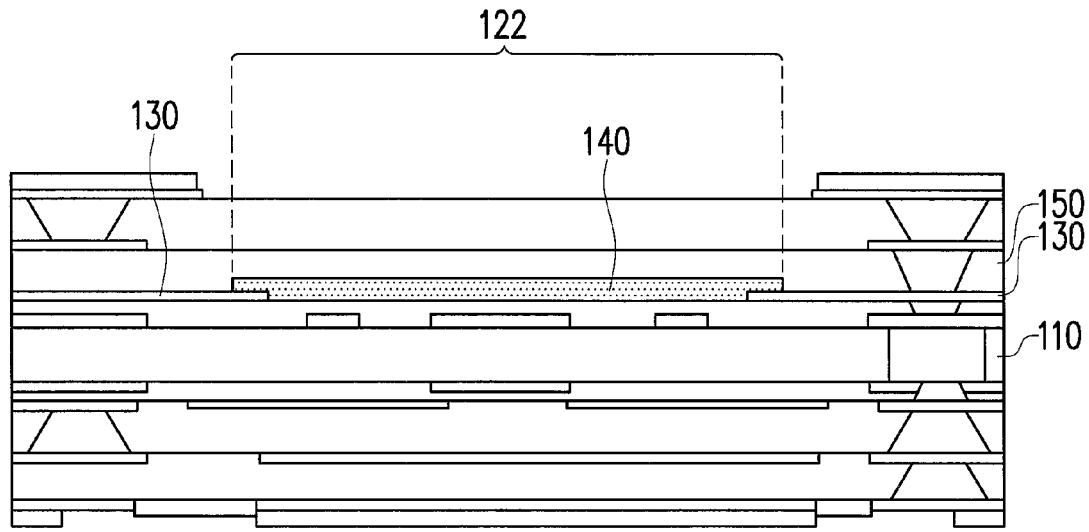

Referring to FIG. 1D, a release film 140 is disposed on the projection area 122 of the first dielectric layer 120 and covers the portion of the laser-resistant metallic pattern 130 within the projection area 122. That is to say, the release film 140 covers the projection area 122 of the first dielectric layer 120, and covers the overlapped portion of the laser-resistant metallic-pattern 130 and the periphery of the projection area 122. Referring to FIG. 1E, then, a second dielectric layer 150 is formed on the first dielectric layer 120, in which the second dielectric layer 150 covers the release film 140 and the laser-resistant metallic pattern 130. Thereafter, the usual process of a circuit layer for a circuit substrate with multiple layers is repeatedly performed to form the circuit layers stacked by each other on the second dielectric layer 150 until the required layer number of the circuit layers is met.

Figure 1F:
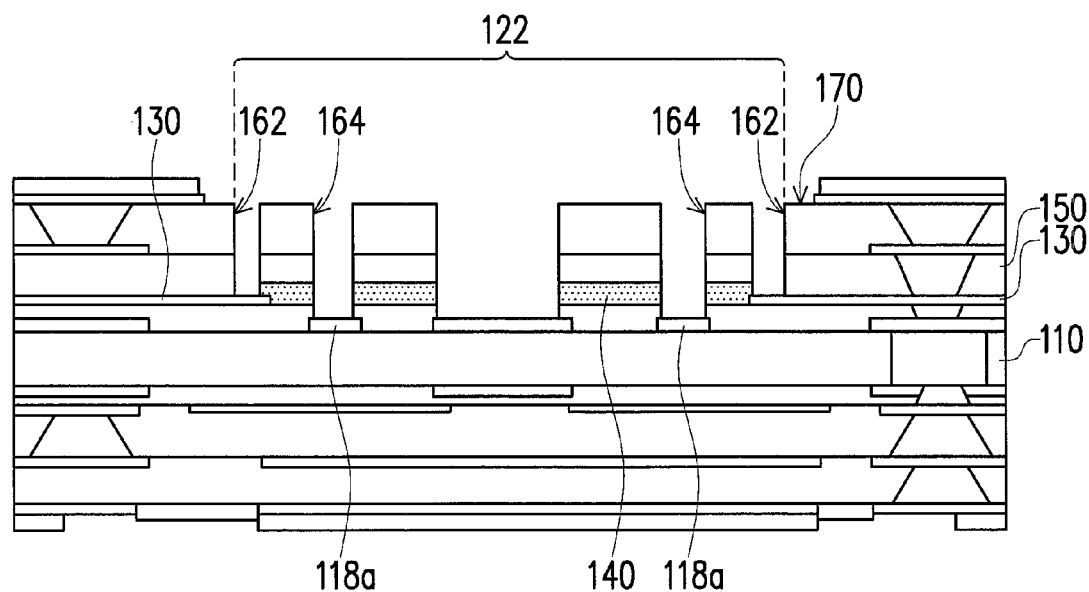

Referring to FIG. 1F, a first open hole 162 and a plurality of second open holes 164 are formed. In more details, the first open hole 162 surrounds the projection area 122, penetrates through the second dielectric layer 150 and extends to the laser-resistant metallic pattern 130. That is to say, the first open hole 162 takes the portion of the laser-resistant metallic pattern 130 overlapped with the projection area 122 as the profile thereof and penetrates from the outer surface 170 of the multiple circuit layers of the substrate structure to the second dielectric layer 150, and then extends to the laser-resistant metallic pattern 130 under the second dielectric layer 150. In the embodiment, the method of forming the first open hole 162 and the second open holes 164 includes laser drilling, and the material of the laser-resistant metallic pattern 130 includes copper, palladium, nickel and silver. Since the laser is unable to penetrate copper, palladium, nickel and silver, so that the laser-resistant metallic pattern 130 is able to control the penetrating depth of the laser drilling. Thus, the first open hole 162 circling the above-mentioned profile on the projection area 122 and the first open hole 162 downward penetrates till the laser-resistant metallic pattern 130 then stop. The second open holes 164 respectively penetrate through the second dielectric layer 150 and extent to the pads 118a. The material of the pads 118a is the same as above, copper, palladium, nickel and silver for controlling the penetrating depth of the laser drilling.

Figure 1G:
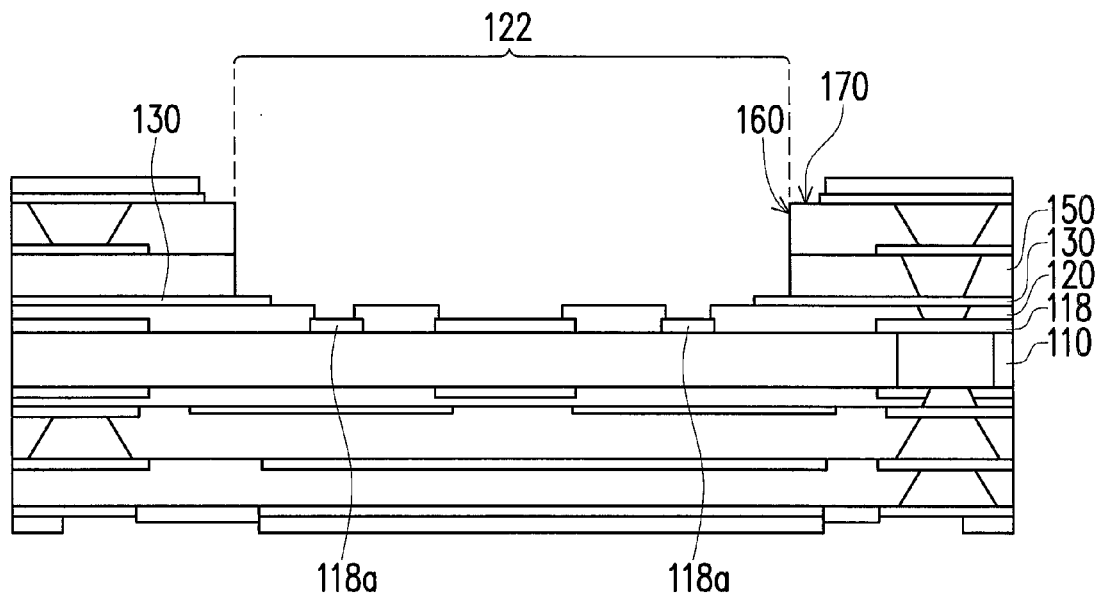

Further, referring to FIGS. 1F and 1G, the release film 140 in FIG. 1F is separated from the first dielectric layer 120 to form a component-disposing cavity 160 as shown by FIG. 1G for disposing electronic components. In general, the material of the release film 140 includes colloid with viscosity such as epoxy, polyethylene (PE) and polypropylene (PP), which the disclosure is not limited to. The release film 140 is usually a film able to be separated, and the film may be without viscosity or with slight viscosity after contacting a specific material under a specific condition. In the embodiment. the release film 140 is easy to be separated from the first dielectric layer 120, and after the first open hole 162 circles the above-mentioned profile of the projection area 122 and first open hole 162 downwards penetrates till the laser-resistant metallic pattern 130, the release film 140 is separated from the first dielectric layer 120 to remove the circuit layers on and above the release film 140 to form the above-mentioned component-disposing cavity 160. At the time, the process for a substrate having a component-disposing area in the embodiment is finished.

Figure 1H:
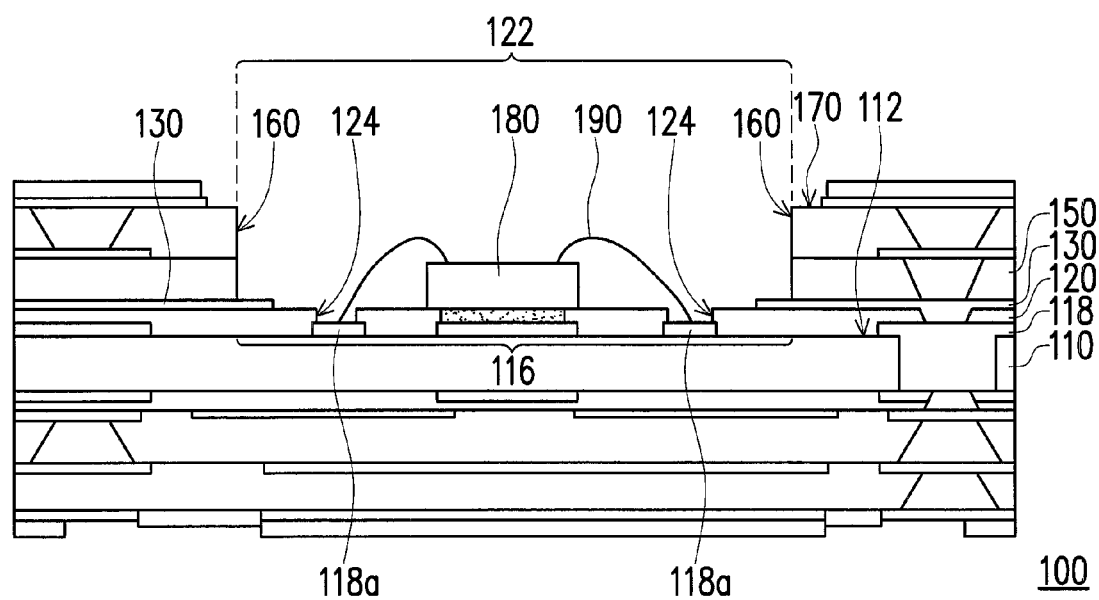

Then, as shown by FIG. 1H, an electronic component 180 of the embodiment is disposed in the component-disposing cavity 160 and electrically connected to the pads 118a. In the embodiment, the electronic component 180 can be, for example, a chip and electrically connected to the pads 118a by wire bonding so as to bury the electronic component 180 in the substrate, which the disclosure is not limited to. In other embodiments of the disclosure, the electronic component 180 can be electrically connected to the pads 118a by flip-chip bonding as well.

Following the above-mentioned process, a substrate structure 100 having a component-disposing area as shown by FIG. 1H is fabricated and includes a core layer 110, a first dielectric layer 120, a laser-resistant metallic pattern 130 and a second dielectric layer 150. The core layer 110 includes a first surface 112, a patterned metallic layer 118 and a component-disposing area 116. The patterned metallic layer 118 is disposed on the first surface 112 and includes a plurality of pads 118a. The pads 118a are located within the component-disposing area 116. The first dielectric layer 120 is disposed on the core layer 110 and includes a plurality of openings 124 for respectively exposing the pads 118a. The laser-resistant metallic pattern 130 is disposed on the first dielectric layer 120 and surrounds a projection area 122 as shown by FIG. 1C. A part of the laser-resistant metallic pattern 130 is overlapped with the periphery of the projection area 122. It should be noted that the laser-resistant metallic pattern 130 and the pads 118a are not located at the same layer of the substrate structure, instead, the pads 118a are located on the core layer 110 while the laser-resistant metallic pattern 130 is located on the first dielectric layer 120 above the core layer 110.

The second dielectric layer 150 is disposed on the first dielectric layer 120 and covers the laser-resistant metallic pattern 130. The second dielectric layer 150 includes a component-disposing cavity 160 corresponding to the projection area 122, penetrating through the second dielectric layer 150 and communicated with the openings 124 to expose the pads 118a. In the embodiment, the substrate structure 100 having a component-disposing area can further include multiple circuit layers stacked with each other on the second dielectric layer 150, and the number of the circuit layers is depending on the actual demands of products. The component-disposing cavity 160 penetrates through to the second dielectric layer 150 from the outer surface 170 of the circuit layers and extends to the laser-resistant metallic pattern 130 below, so as to expose the portion of the laser-resistant metallic pattern 130 surrounding the projection area 122.

In the embodiment, the substrate structure 100 having a component-disposing area can further have an electronic component 180 and a plurality of bonding wires 190. The electronic component 180 is disposed in the component-disposing cavity 160 and electrically connected to the pads 118a. The bonding wires 190 are respectively connected between the pads 118a and the electronic component 180, so that the electronic component 180 can be electrically connected to the pads 118a via the bonding wires 190 and the electronic component 180 can be buried in the substrate, which the disclosure is not limited to.

Figure 2:
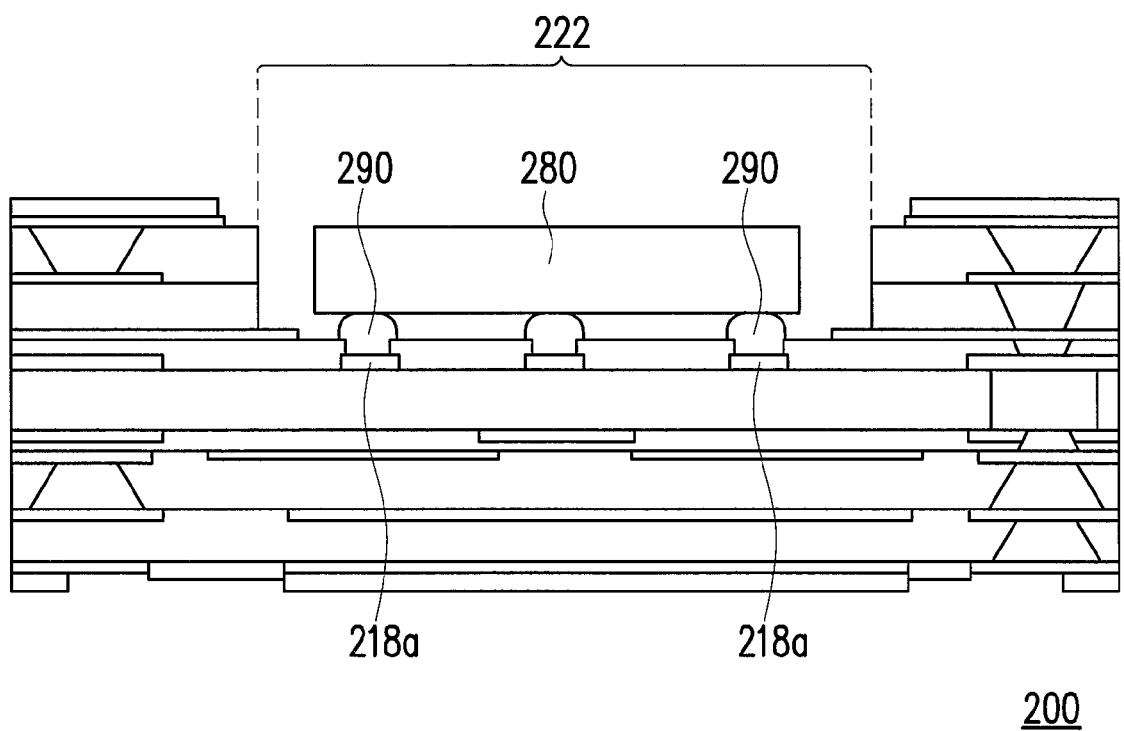
FIG. 2 is a cross-sectional diagram showing a manufacturing process of a substrate having a component-disposing area according to another embodiment of the disclosure.

FIG. 2 is a cross-sectional diagram showing a manufacturing process of a substrate having a component-disposing area according to another embodiment of the disclosure. Referring to FIG. 2, in the substrate structure 200 having a component-disposing area of the present embodiment, a plurality of solder balls 290 are substituted for the bonding wires 190 to electrically connect the electronic component 280 and the pads 218a. At the time, the electronic component 280 disposed within the projection area 222 is electrically connected to the pads 218a through the solder balls 290 by flip-chip bonding.

In summary, in the disclosure, the dielectric layers are substituted for the solder mask layer on the core layer within the component-disposing area, so that the dielectric layers located on the inside and the outside of the component-disposing area can be integrally and simultaneously formed, which simplifies the conventional complicated substrate process. In addition, in the disclosure, a laser-resistant metallic pattern disposed on the dielectric layer is for preventing the laser drilling from penetrating the dielectric layer, unlike the prior art where the laser-resistant metallic pattern and the pads are together disposed on the core layer so as to avoid the difficulty in controlling laser drilling depth. In short, the disclosure certainly simplifies the manufacturing process of a substrate having a component-disposing area and improves the product yield rate.

It will be apparent to those skilled in the art that the descriptions above are several preferred embodiments of the disclosure only, which does not limit the implementing range of the disclosure. Various modifications and variations can be made to the structure of the disclosure without departing from the scope or spirit of the disclosure. The claim scope of the disclosure is defined by the claims hereinafter.

What is claimed is:

1. A substrate structure having a component-disposing area, comprising:
    a core layer, comprising a first surface, a patterned metallic layer and a component-disposing area, wherein the patterned metallic layer is disposed on the first surface and comprises a plurality of pads and the pads are located within the component-disposing area;
    a first dielectric-layer, disposed on the core layer and comprising a plurality of openings respectively exposing the pads;
    a laser-resistant metallic pattern, disposed on and directly contacting the first dielectric layer and surrounding a projection area of the first dielectric-layer which the component-disposing area orthogonally projected on; and
    a second dielectric layer, disposed on the first dielectric layer and covering the laser-resistant metallic pattern, wherein the second dielectric layer comprises a component-disposing cavity corresponding to the projection area, penetrating through the second dielectric layer and communicated with the openings to expose the pads, and the component-disposing cavity exposing a part of the laser-resistant metallic pattern surrounding the projection area.

2. The substrate structure having the component-disposing area as claimed in claim 1, further comprising:
    an electronic component, disposed in the component-disposing cavity and electrically connected to the pads.

3. The substrate structure having the component-disposing area as claimed in claim 2, further comprising:
    a plurality of bonding wires, electrically connected to the pads and the electronic component respectively.

4. The substrate structure having the component-disposing area as claimed in claim 2, further comprising:
    a plurality of solder balls, electrically connected to the pads and the electronic component respectively.

5. The substrate structure having the component-disposing area as claimed in claim 1, wherein material of the laser-resistant metallic pattern comprises copper, palladium, nickel and silver.

* * * * *